United States Patent [19]
Cathey

[11] Patent Number: 5,409,563
[45] Date of Patent: Apr. 25, 1995

[54] METHOD FOR ETCHING HIGH ASPECT RATIO FEATURES

[75] Inventor: David A. Cathey, Boise, Id.
[73] Assignee: Micron Technology, Inc., Boise, Id.
[21] Appl. No.: 23,935
[22] Filed: Feb. 26, 1993
[51] Int. Cl.[6] .......................................... H01L 21/00
[52] U.S. Cl. .................... 156/643; 156/662; 156/646; 156/667; 156/656; 156/657
[58] Field of Search ............... 156/662, 643, 646, 667, 156/656, 657

[56] References Cited

U.S. PATENT DOCUMENTS

| | | | |
|---|---|---|---|
| 5,068,007 | 11/1991 | Rogers et al. | 156/643 |
| 5,160,405 | 11/1992 | Miyouchi et al. | 156/643 |
| 5,200,032 | 4/1993 | Shinohara | 156/643 |

OTHER PUBLICATIONS

"Fast Silicon Etching Using an Expanded Cascade Arc Plasma in ASFG/Argon Mixture"; Beulens et al.; J. Vac. Sci., B, vol. 10, No. 6; pp. 2387–2392; Dec. 1992.
"Highly Selective Sputtering of Silicon from TiSi$_2$ at Elevated Temperature"; Harper et. al; Appl. Phys. Lett., vol. 60, No. 10; pp. 1196–1198; Mar. 1992.
"Temperature Dependence of Reactive Ion Etching of GaAs with CCl$_2$F$_2$"; Pearton et al.; J. Appl. Phys., vol. 66, No. 8; pp. 3829–3849; Oct. 1989.
"Air Microwave Plasma Etching of Polycrystalline Diamond Thin Films", J. Elect. Soc.; vol. 139, No. 7, pp. 1988–1993; Jul. 1992, Ramesham et. al.

Primary Examiner—R. Bruce Breneman
Assistant Examiner—George Goudreau
Attorney, Agent, or Firm—Stephen A. Gratton

[57] ABSTRACT

A method for forming high aspect ratio features such as trenches in a semiconductor structure includes dry etching a substrate in a glow discharge system at elevated temperature. With the dry etching carried out at an elevated temperature of between about 300° to 1100° C., the diffusion of a reactant gas into the features is increased and the diffusion of byproduct molecules out of the features is increased. This increases the etch rate for forming the features, and allows features with very high aspect ratio to be formed at a high etch rate.

15 Claims, 2 Drawing Sheets

METHOD FOR ETCHING HIGH ASPECT RATIO FEATURES

FIELD OF THE INVENTION

This invention relates to microelectronics and to the plasma etching of high aspect ratio features. More specifically, this invention relates to a novel process for etching high aspect ratio features which may be used in the formation of trench storage capacitors, trench isolation, or vertical surface MOS device fabrication.

BACKGROUND OF THE INVENTION

Semiconductor manufacturing technology has advanced to the point where a single die may contain millions of active devices. As an example, the manufacture of 16 Mb DRAMs is now possible and 64 Mb and 256 Mb prototypes are being developed. A key requirement for achieving such high device packing density is the formation of suitable storage capacitors.

In general, DRAMs are formed with either stacked storage capacitors or trench storage capacitors. Both capacitor structures can be adapted to high density applications. Trench storage capacitors, however, offer some advantages over stacked storage capacitors including a smoother surface topography.

With a trench capacitor, a trench is etched vertically from the wafer surface into a substrate, which is typically formed of silicon. A dielectric material is then formed on the trench sidewalls by deposition (i.e. $Si_3N_4$) or oxidation (i.e. $SiO_2$) and the center of the trench is filled with a conductor (e.g. polysilicon). The final structure is wired from the surface. The silicon and polysilicon serve as the two electrodes of the capacitor with the silicon dioxide dielectric between them.

For high density applications, anisotropic dry etching is a preferred method of forming the trenches. This produces a nearly vertical but slightly tapered sidewall profile.

As the cell size available for capacitors decreases, the surface opening of a trench capacitor also decreases. The surface area available for capacitance thus decreases. To compensate for this loss of surface area, the trench must be etched deeper. A high aspect ratio trench is one that is formed with a depth that is much greater than its width. For high density applications, aspect ratios (depth/width), of at least 5:1 are preferred. Aspect ratios of greater than 40:1, however, have been achieved in laboratory experiments.

Glow discharge dry etching is a preferred method of forming high aspect ratio trenches. With glow discharge dry etching, the wafers are placed in a vacuum chamber and the trenches are etched using a gas mixture containing an etching gas. Typically, the gas mixture is energized to a plasma state using a power source and a radio frequency (RF) field. The gas provides a medium in which a glow discharge can be initiated and maintained. An etch mask formed of a material such as silicon dioxide ($SiO_2$) is used to pattern the location of the trenches and the size of the trench openings. The trench depth in turn, is a function of the etch rate and the etch time.

A problem with the use of glow discharge dry etching processes to form high aspect ratio trenches, is that the etch rate for cutting the trench is limited. It is theorized by the present inventor that these problems arise because the etching process is influenced by the rate of diffusion of reactant materials into the trench and by the rate of diffusion of byproduct materials out of the trench. These rates of diffusion vary with the depth of the trench.

This situation is illustrated in FIG. 1. In FIG. 1, a trench 10 is being etched into a silicon substrate 12. An etch mask 14 has been deposited over the substrate 12 and includes an opening 15 to define the location of the trench 10. A process gas may be formed as a cracked feed gas that includes reactant materials 22 that react with and remove the unprotected silicon to form the trench 10. In FIG. 1, the reactant materials 22 are illustrated as the triangular shapes. The diffusion of the reactant materials 22 is thermally random but a net diffusion is downward into the trench 10 as indicated by downward arrow 18.

As the trench is formed, a passivated layer 24 of material (i.e. non volatile film) builds up on the sidewalls of the trench 10. Etching ions 16 contained within the process gas aid in the etching of the unprotected silicon and in particular prevent the formation of the passivated layer 24 on the bottom most portion 25 of the trench 10. This allows the reactant materials 22 to continue etching the trench 10 into the substrate 12.

The reaction of the reactant materials 22 with the silicon substrate 12 also produces byproduct molecules 20. The byproduct molecules 20 are indicated by the solid circles in FIG. 1. The diffusion of the byproduct molecules 20 is thermally random but a net diffusion is upward and out of the trench 10 as indicated by upward arrow 19. In general, the reaction mechanics and etch rates for forming the trench 10 are affected by the concentration of the reactant materials 22. In addition, the reaction mechanics for forming the trench 10 are affected by the concentration of the byproduct molecules 20.

To a lesser extent, the reaction mechanics for forming the trench 10 are affected by the thermal diffusion of the etching ions 16 into the trenches 10. In general, however, the concentration of the etching ions 16 is much smaller than that of the reactant materials 22 (i.e. one ion for every $10^3$–$10^4$ gas molecules). Moreover, because etching ions 16 are accelerated by the voltage between the plasma and substrate 12 into the trench 10, the rate of transport of the etching ions 16 into the trench 10 is not greatly influenced by classical diffusion/concentration mechanics and is not greatly reduced by an increasing aspect ratio.

The concentration of the reactant materials 22 and of the byproducts molecules 20 varies with the depth of the trench 10. In general, the reactant materials 22 are more concentrated at shallow depths close to the surface of the substrate 12, and become less concentrated as the depth of the trench 10 increases. Conversely, the concentration of the byproduct molecules 20 increases with the depth of the trench 10.

This situation is illustrated in the graphs shown in FIGS. 2 and 3. As shown in FIG. 2, the concentration of reactant materials 22 decreases with the depth of the trench. Conversely, and as shown in FIG. 3, the concentration of byproduct molecules 20 increases with the depth of the trench.

This situation limits the etch rate for forming the trench. The etch rate slows as the trench depth increases due to the reduced transport of the reactant materials 22 to the lower portions of the trench as well as the reduced transport of the byproduct molecules away from the lower portions of the trench. Stated differently, the average etch rate decreases with increasing aspect ratio. This phenomena may prevent the trench 10 from reaching the required depth. More importantly, this phenomena may prevent a trench from forming within an acceptable period of time in a production process.

These reaction mechanics cause problems during the large scale manufacture of semiconductor devices. In particular, the decreasing etch rate necessitates longer etch times. The throughput of the etching process step is thus unacceptably low. The present invention is directed to a method of increasing the etch rate of trenches formed in a semiconductor substrate during such a dry etch step.

Accordingly, it is an object of the present invention to provide a method for forming high aspect ratio features in a semiconductor manufacturing process using a glow discharge dry etching process. Yet another object of the present invention is to provide a method for forming high respect ratio features in a substrate in which a rate of formation of the features is improved. It is a further object of the present invention to provide a dry etching process for forming high aspect ratio trenches in a substrate. It is yet another object of the present invention to provide a dry etching process for forming high aspect ratio trenches in a semiconductor structure that is adapted to large scale semiconductor manufacture and in which a throughput of parts during trench formation is improved.

SUMMARY OF THE INVENTION

In accordance with the present invention, a method for forming high aspect ratio features in a substrate is provided. The invention, simply stated, comprises the glow discharge dry etching of high aspect ratio features into a solid substrate at a fast etch rate and at elevated temperatures. The elevated temperatures increase the diffusion rate of reactants into the features and the diffusion rate of byproduct molecules out of the features. These increased diffusion rates increase the etch rate for forming the feature.

In a preferred embodiment of the invention, high aspect ratio trenches are etched into a silicon substrate of a semiconductor structure utilizing a glow discharge dry etching process. The dry etching process is carried out at an elevated temperature of between about 200°–800° C. An etching mask formed of an inorganic material such as silicon dioxide ($SiO_2$), silicon nitride ($Si_3N_4$), or a high temperature polymeric material such as a polymide defines the location of the trench openings. (In this application a conventional photoresist mask cannot be used successfully). A process gas stream contains a reactant gas that reacts with the substrate but which is etch selective to the mask. As an example, for a silicon substrate and a silicon dioxide ($SiO_2$) mask, the process gas stream may contain a mixture of HBr and oxygen as a reactive or etching gas.

Other objects, advantages, and capabilities of the invention will become more apparent as the description proceeds.

DETAILED DESCRIPTION OF THE PREFERRED EMBODIMENT

The present invention, broadly stated, is directed to a process for etching very high aspect ratio features in a material or substrate.

For forming trenches in a substrate of a semiconductor structure, the process of the invention, generally stated, includes the steps of:

depositing an inorganic mask on the substrate, and etching the trenches utilizing a glow discharge dry etching process performed at elevated temperatures.

Figure 4:
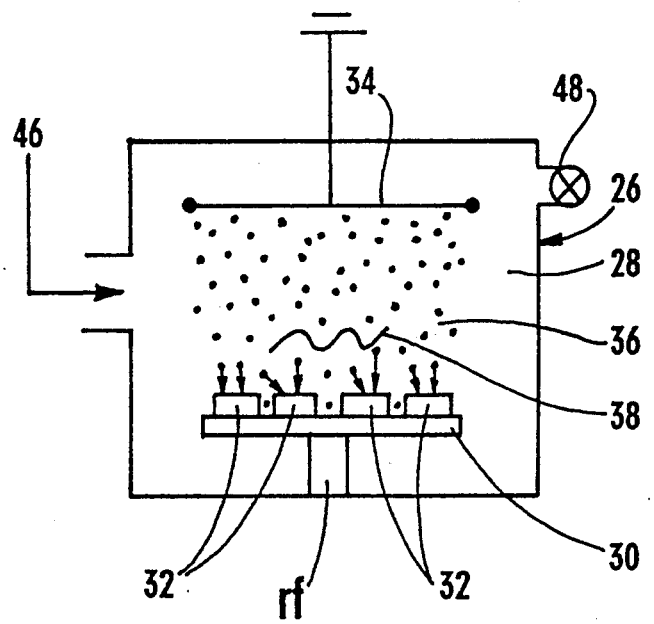
FIG. 4 is a schematic view of a plasma dry etch system suitable for etching a substrate in accordance with the method of the invent ion.

This process can be performed in a conventional plasma etching system which has been modified to accommodate higher temperature processing. Such a plasma etching system is shown in FIG. 4 and is generally designated as 26. The plasma etching system 26 includes a process chamber 28 in flow communication with a source or feed gas 46.

Inside the process chamber 28 is an rf pallet 30 which supports a plurality of semiconductor wafers 32 to be etched. The rf pallet 30 is connected to an rf power source. A ground electrode 34 mounted within the process chamber 28 opposite the rf pallet 30 is connected to ground. With this arrangement the feed gas 46 is excited by the rf energy to form a plasma 36.

Figure 1:
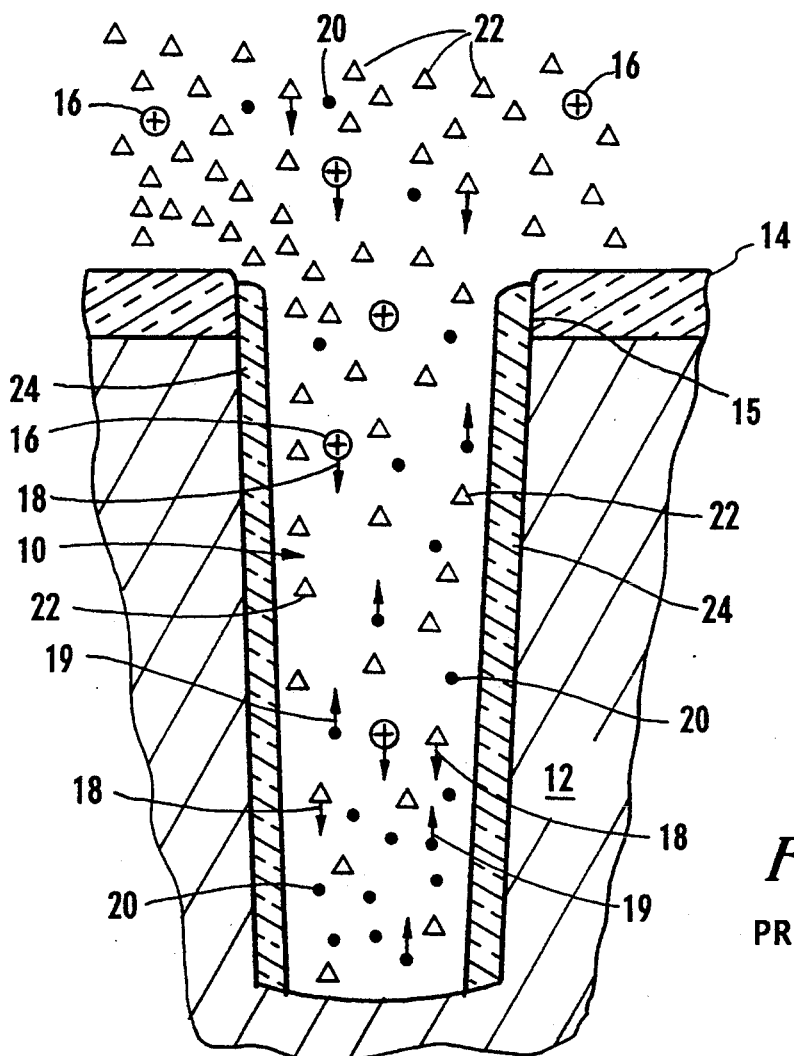
FIG. 1 is a schematic diagram of a trench being etched into a silicon substrate and illustrating the diffusion of reactant gases and etchant ions into the trench and the diffusion of byproduct molecules out of the trench.
Figure 2:
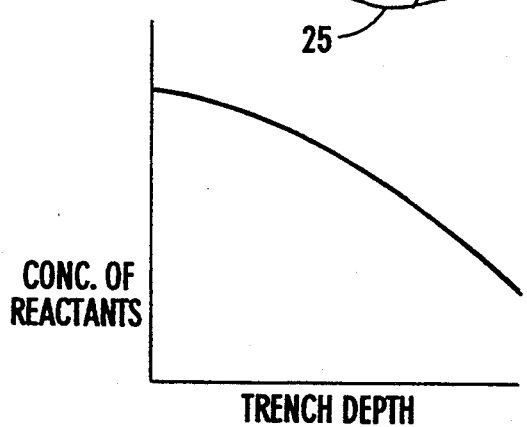
FIG. 2 is a graph showing the concentration of reactants versus the trench depth for an etching process.
Figure 3:
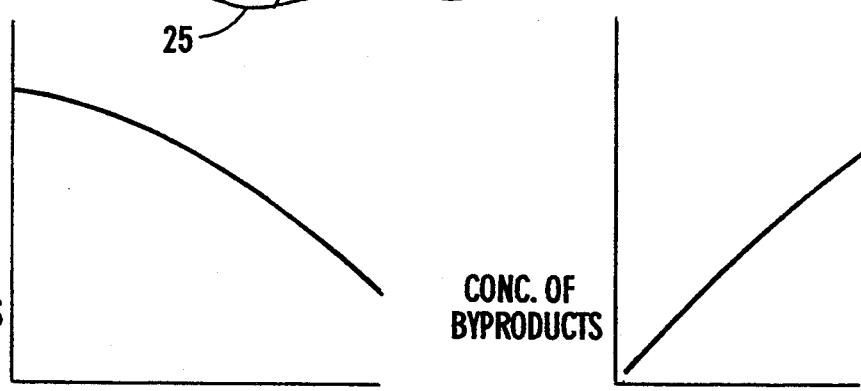
FIG. 3 is a graph showing the concentration of by-product molecules versus the trench depth for an etching process.

With such a plasma etching system 26, the wafers are located in the generated plasma 36, which is directed at the wafer surface. The plasma 36 contains the reactant gases (i.e. gas etchants) that react with the wafer 32 as previously explained to etch the trenches (10 FIG. 1). The chemistry of the feed gas 46 can be selected such that the wafer substrate (12 FIG. 1) is etched but the etching mask (14 FIG. 1) is not adversely affected. In general, the etch rate of such a system is a function of the rf power supplied to the electrodes, the chemistry of the feed gas 46, and the vacuum level in the process chamber 28. The etch rate may also be affected by a magnetic field which may be applied to the plasma 36 by techniques that are known in the art.

In accordance with the method of the invention, a heating means such as a heating element 38 (FIG. 4) is utilized to heat the system and particularly to elevate the temperature of the gases in the plasma 36 and the temperature of the wafers 32 (or any other material or substrate to be etched). Preferably the temperature of the substrate to be etched (e.g. wafers ) and the gases in the plasma 36 immediately adjacent to the wafers 32 are at an elevated temperature of between about 300°–1100° C. A temperature range of about 600°–1100° C. is preferred. However, an optimum temperature range is 400° to 800° C. The surface of the wafers 32 is also maintained at about this elevated temperature.

In addition to heating the gases in the plasma 36 with a heating element 38 (or other means), the wafers 32 and pallet 30 may also be heated with a separate element (not shown). The heated surface of the wafer 32 will thus function to heat the gases within the plasma 36. The gas stream 46 can also be preheated and the walls of the process chamber 28 can be heated. A suitably valved outlet 48 is provided for exhausting the gases from the process chamber 28.

Table 1 is a compilation of suitable feed gas components for forming trenches in a silicon substrate and typical etch gas compounds used to form the feed gas. The etch mask is preferably formed of an inorganic material which may be grown or deposited on the substrate (12 FIG. 1).

TABLE 1

| ETCH MASK | FEED GAS COMPONENTS | TYPICAL GAS COMPOUNDS USED TO SUPPLY THE FEED GAS COMPONENTS |
|---|---|---|
| $SiO_2$ | Oxygen | $O_2$, $N_2O$ |
| | Bromine | HBr, $BR_2$ |
| | Fluorine | $CF_4$, $SF_6$, $NF_3$ |
| | Chlorine | $Cl_2$, HCl |
| $Si_3N_4$ | Nitrogen | $NH_3$, $N_2O$, $N_2$ |
| | Bromine | HBr, $Br_2$ |
| | Fluorine | $CF_4$, $SF_6$, $NF_3$ |
| | Chlorine | $Cl_2$, HCl |

ANALYSIS

Observation of trench etching data indicates that with a prior art etching procedure, trench etching initially proceeds at a reasonably linear rate. After a period of time and depending on the aspect ratio, the depth of the etched feature becomes nearly proportional to the square root of the etching time ($\sqrt{t}$).

Figure 5:
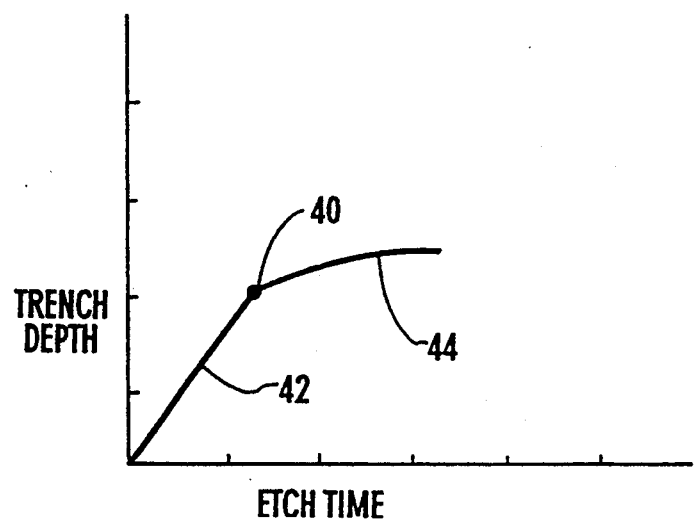
FIG. 5 is a graph showing trench depth as a function of etch time during a prior art dry etching process.

This phenomena is shown graphically in FIG. 5. FIG. 5 is a plot of trench depth vs. etch time in a prior art glow discharge etching process. As shown in FIG. 5, at point 40 on the graph the etch rate has begun to decrease from an initial linear rate, as indicated by curve 42, to a slower rate as indicated by curve 44. In general, this slower rate is proportional to the square root of the etching time $\sqrt{t}$. As etching continues this etch rate approaches zero.

These results are consistent with the diffusion process previously described and with Fick's second law of diffusion. As previously described, the decreased diffusion of reactants into the trench and byproducts out of the trench reduces the etch rate as indicated by curve 44. This is termed herein as the diffusion limited condition.

This system can be analyzed as follows. From Fick's first law of diffusion it can be determined that in a simplified system, the flux of a diffusing species (J) is equal to the diffusivity (D) multiplied by the concentration gradient of the species dn/dx. The diffusivity of a molecular species can be estimated by $D = -\frac{1}{2}\lambda \overline{V}$ where $\lambda$ is the mean free path distance between gases, and $\overline{V}$ is the average translational velocity of the gas molecules without respect to direction.

The kinetic theory of gases tells us that the kinetic energy of a volume of gas is $Ke = 3/2 \, RT$ where R is the universal gas constant and T is the absolute temperature. For 1 mol of gas, the total kinetic energy can be calculated by summing up the individual kinetic energies of each gas molecule. In equation form $Ke = \frac{1}{2}mv^2L$, where m is the mass of an individual gas atom, v is the average translational velocity without respect to direction and L is Avogadro's number.

This yields $v = (\sqrt{3R/Mm})(\sqrt{T})$ where R is the universal gas constant and Mm is the mass of 1 mol of gas and T is the absolute temperature. Therefore $$D = 1/2\lambda \sqrt{\frac{3R}{Mm}} \sqrt{T}.$$

From the Ideal Gas Law, which closely predicts the behavior of real gases at low pressures and high temperatures, $Pv = nRT$. In this equation, P is the pressure, v is the volume, n is the number of moles of gas, and R is the universal gas constant. It is determinable that P is linearly proportional to T, and that at a constant pressure, the concentration $n/v$ is linearly proportional to $1/T$. In a system where concentration is proportional to $1/T$, the mean free path L is linearly proportional to T, and the concentration of reactant gas species above the etched feature is proportional to $1/T$.

The diffusivity D in Fick's first law, in the system described above is a function of $(T)^{3/2}$, and dn/dx is a function of $(T)^{-1}$. From this it can be seen that the rate of diffusion of gasses in and out of a high aspect ratio feature which is in the condition of being diffusion limited (i.e. curve 44 FIG. 5) can be increased by raising the temperature of the system, and thereby increasing the etch rate. The increase in the etch rate can characteristically be estimated as increasing with $\sqrt{T}$ in the diffusion limited etch condition.

Thus, the invention provides a simple, yet unobvious method for increasing the etch rate for forming trenches in a semiconductor structure. This permits trenches with a very high aspect ratio to be formed during larger scale semiconductor manufacture. With the increased etch rate the throughput of parts during the etching step can be increased. This process is particularly effective for etching high aspect ratio trenches for use as trench storage capacitors.

Although the process as described in a preferred embodiment is adapted to the formation of trench storage capacitors, as will be apparent to those skilled in the art other applications of the inventive concepts disclosed herein are possible. It is intended therefore that the following claims include such alternate embodiments.

I claim:

1. A method for etching features having an aspect ratio of at least five to one in a material, said method comprising:
    forming a mask on the material with the mask having openings to the material; and
    etching the material through the openings in a glow discharge dry etching system containing gases excited to a plasma and with the gases heated to a temperature of between 600° to 1100° C. to diffuse a reactant gas into the features and byproduct molecules out of the features 2. The method as claimed in claim 1 and wherein the gases and the material are heated to a temperature of 600° to 1100° C.

3. The method as claimed in claim 1 and wherein the mask is formed of an inorganic material.

4. The method as claimed in claim 1 and wherein the dry etching system is an rf plasma etching system including a means for heating the reactant gas.

5. The method as claimed in claim 1 and wherein the etched features are used to fabricate trench storage capacitors.

6. In semiconductor manufacturing, a method of etching features having an aspect ratio of at least five to one in a silicon substrate comprising;

forming an inorganic etch mask on the silicon substrate with openings through the etch mask to the substrate;

etching the silicon substrate through the openings using gases in a glow discharge rf dry etching system to form features by the reaction of a reactant gas with the substrate;

diffusing the reactant gas into the features by heating the reactant gas to a temperature of between 300° C. to 1100° C.; and diffusing byproduct molecules out of the silicon substrate by heating the byproduct molecules to a temperature of between 300° to 1100° C.

7. The method as claimed in claim 6 and wherein the reactant gas is selected from the group consisting of a species of chlorine, bromine, nitrogen, fluorine, and oxygen.

8. The method as claimed in claim 6 and wherein the reactant gas includes a gas selected from the group consisting of a species of chlorine, fluorine or bromine combined with a gas selected from the group consisting of a species of nitrogen, oxygen and a noble gas.

9. The method as claimed in claim 6 and wherein the etch mask is formed of an inorganic material selected from the group consisting of $SiO_2$ and $Si_3N_4$.

10. The method as claimed in claim 6 and wherein the reactant gas and substrate are heated by a heating means contained within a vacuum chamber of the rf dry etching system.

11. The method as claimed in claim 10 and wherein the substrate is connected to an rf power source and a negative electrode is mounted opposite to the substrate.

12. In semiconductor manufacture, a method for forming trench storage capacitors having an aspect ratio of at least five to one in a silicon substrate, said method comprising:

forming a mask on the substrate with the mask having openings to the substrate; and etching the substrate through the openings in a glow discharge dry etching system containing gases excited to a plasma and with the gases heated to a temperature of between 300° to 1100° C. to diffuse a reactant gas into the trenches and byproduct molecules out of the trenches.

13. The method as claimed in claim 12 and wherein the trenches are used for fabricating trench storage capacitors.

14. The method as claimed in claim 12 and wherein the glow discharge dry etching system includes a support for supporting the substrate with the support in electrical communication with an rf power source.

15. The method as claimed in claim 12 and wherein the gases include a gas selected from the group consisting of chlorine, fluorine and bromine species combined with a gas selected from the group consisting of a nitrogen, oxygen and a noble gas species.

* * * * *